(12) United States Patent
Chen et al.

(10) Patent No.: US 9,653,407 B2
(45) Date of Patent: May 16, 2017

(54) SEMICONDUCTOR DEVICE PACKAGES

(71) Applicant: Advanced Semiconductor Engineering, Inc., Kaohsiung (TW)

(72) Inventors: Shih-Ren Chen, Kaohsiung (TW); Cheng-Nan Lin, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/791,043

(22) Filed: Jul. 2, 2015

(65) Prior Publication Data

US 2017/0005042 A1    Jan. 5, 2017

(51) Int. Cl.
*H01L 23/00* (2006.01)
*H01L 23/552* (2006.01)
*H01L 21/56* (2006.01)

(52) U.S. Cl.
CPC .......... *H01L 23/552* (2013.01); *H01L 21/561* (2013.01)

(58) Field of Classification Search
CPC .................................................. H01L 23/552
See application file for complete search history.

(56) References Cited

U.S. PATENT DOCUMENTS

| 7,928,538 B2 | 4/2011 | Salzman |
| 8,963,298 B2 | 2/2015 | Yao et al. |
| 2016/0111375 A1* | 4/2016 | Bair ...................... H01L 23/552 438/110 |

FOREIGN PATENT DOCUMENTS

CN    102244069    11/2011

* cited by examiner

*Primary Examiner* — William Harriston
(74) *Attorney, Agent, or Firm* — Foley & Lardner LLP; Cliff Z. Liu (57) ABSTRACT

The present disclosure relates to a semiconductor device package and a method for manufacturing the semiconductor device package. The semiconductor device package includes a substrate, a grounding element, a component, a package body and a conductive layer. The grounding element is disposed in the substrate and includes a connection surface exposed at a second portion of a lateral surface of the substrate. The component is disposed on a top surface of the substrate. The package body covers the component and the top surface of the substrate. A lateral surface of the package body is aligned with the lateral surface of the substrate. The conductive layer covers a top surface and the lateral surface of the package body, and further covers the second portion of the lateral surface of the substrate. A first portion of the lateral surface of the substrate is exposed from the conductive layer.

18 Claims, 9 Drawing Sheets

SEMICONDUCTOR DEVICE PACKAGES

BACKGROUND

1. Technical Field

The present disclosure relates generally to semiconductor device packages. More particularly, the present disclosure relates to semiconductor device packages with an electromagnetic interference shield.

2. Description of the Related Art

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference (EMI). Smaller sized semiconductor devices can exacerbate EMI by providing a higher density of those semiconductor devices within an overall electronic system, and, thus, a higher level of undesired electromagnetic emissions at a neighboring semiconductor device.

In the process of forming a shield to mitigate the EMI, bonding/ball pads of a semiconductor device may be compromised; for example, some conductive material used to form the EMI shield may be inadvertently formed on the bonding/ball pads, which may short-circuit the bonding/ball pads to the EMI shield, which can lead to product failure.

It is against this background that a need arose to develop the semiconductor device packages and related methods described herein.

SUMMARY

According to an embodiment of the present disclosure, a semiconductor device package is provided. The semiconductor device package includes a substrate, a grounding element, a component, a package body and an electromagnetic interference (EMI) shield. The grounding element is disposed in the substrate and includes a connection surface exposed at a second portion of a lateral surface of the substrate. The component is disposed on a top surface of the substrate. The package body covers the component and the top surface of the substrate. A lateral surface of the package body is aligned with the lateral surface of the substrate. The EMI shield covers a top surface and the lateral surface of the package body, and further covers the second portion of the lateral surface of the substrate. A first portion of the lateral surface of the substrate is exposed from the EMI shield.

According to another embodiment of the present disclosure, a method of manufacturing a semiconductor device package is provided. The method includes: (a) providing a substrate having a top surface, a bottom surface opposite to the top surface, and a lateral surface extending from the top surface to the bottom surface, where the lateral surface includes a first portion adjacent to the bottom surface and a second portion aligned with the first portion and adjacent to the top surface. The substrate includes a grounding element exposed at the second portion of the lateral surface of the substrate. The method further includes: (b) attaching an electronic component on the top surface of the substrate; (c) forming a package body on the substrate to encapsulate the electronic component and the top surface of the substrate; (d) covering the first portion of the lateral surface and the bottom surface of the substrate with a first adhesive; (e) forming a conductive layer on a top surface and a lateral surface of the package body, the second portion of the lateral surface of the substrate, and the exposed portion of the grounding element; and (f) removing the first adhesive.

According to another embodiment of the present disclosure, a method of manufacturing a semiconductor device package is provided. The method includes: (a) pressing a substrate with a package body encapsulating a top surface of the substrate into a material in a container to cover a first portion of a lateral surface of the substrate; (b) forming a conductive layer to cover a top surface and a lateral surface of the package body and to further cover a second portion other than the first portion of the lateral surface of the substrate; and (c) removing the container and the material.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
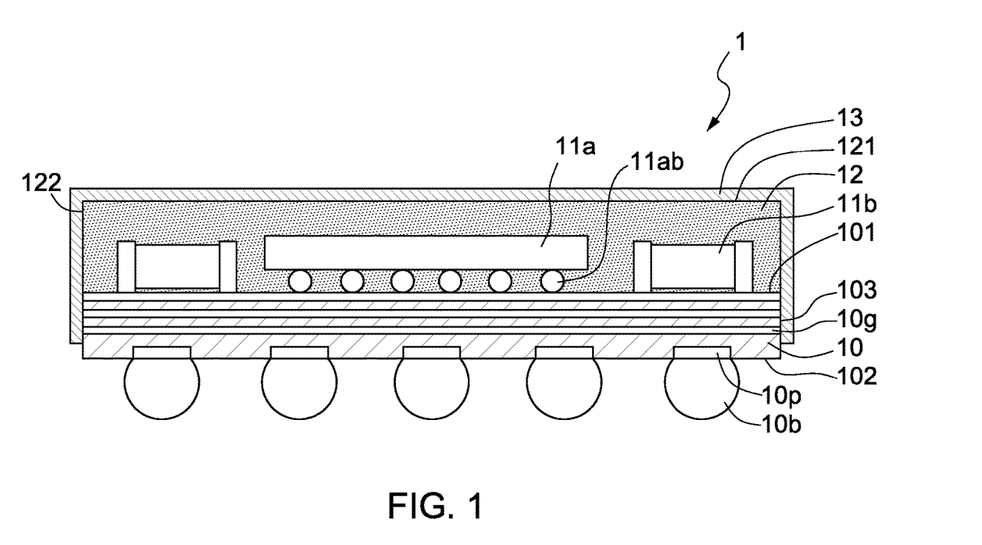
FIG. 1 illustrates a cross-sectional view of a semiconductor device package in accordance with an embodiment of the present disclosure.

FIG. 1 illustrates a cross-sectional view of a semiconductor device package 1 in accordance with an embodiment of the present disclosure. The semiconductor device package 1 includes a substrate 10, a number of components 11a, 11b, a package body 12, and an EMI shield 13.

The substrate 10 comprises a top surface 101 and a bottom surface 102 opposite to the top surface 101. The substrate 10 also comprises a lateral surface 103 extending between the top surface 101 and the bottom surface 102. In one or more embodiments, the lateral surface 103 is substantially planar, and the lateral surface 103 is substantially orthogonal to the top surface 101 or the bottom surface 102.

The substrate 10 includes a grounding element 10g, where a portion of the grounding element 10g is exposed from the lateral surface 103 of the substrate 10. The grounding element 10g is located between the top surface 101 and the bottom surface 102 of the substrate 10. The grounding element 10g includes a connection surface exposed at a lateral surface of the substrate. The grounding element 10g is electrically connected to electrical interconnects included in the substrate 10, and provides electrical pathways to reduce EMI. In one or more embodiments, the grounding element 10g is a portion of an internal grounding via or an internal grounding trace disposed in the substrate 10. In one or more embodiments, the grounding element 10g is a grounding ring disposed along the lateral surface 103 of the substrate 10. In one or more embodiments, the substrate 10 includes multiple grounding elements 10g. In one or more embodiments, the grounding element 10g is a conductive layer disposed within substrate 10, and the conductive layer can include one or more electrically conductive materials, such as metals or metal alloys.

The substrate 10 includes conductive pads 10p on the bottom surface 102 of the substrate. In one or more embodiments, the substrate 10 includes solder balls 10b connected to the conductive pads 10p. The solder balls 10b provide input and output electrical connections for the semiconductor device package 1. In one or more embodiments, one or more of the solder balls 10b are electrically connected to the components 11a, 11b by way of the electrical interconnects included in the substrate 10. In one or more embodiments, at least one solder ball 10b is a ground electrical contact and is electrically connected to the grounding element 10g through the electrical interconnects included in the substrate 10.

The substrate 10 is formed, for example, of a printed circuit board (PCB), such as a paper-based copper foil laminate, a composite copper foil laminate, or a polymer-impregnated glass fiber-based copper foil laminate. The substrate 10 may be replaced by other suitable carrier, such as a leadframe.

The components 11a, 11b are mounted on the top surface 101 of the substrate 10. In one or more embodiments, the component 11a is a semiconductor chip or a die, while the components 11b are passive devices, such as resistors, capacitors, inductors or a combination thereof. The component 11a is flip chip bonded to the substrate 10 by way of conductive bumps 11ab. In one or more embodiments, the component 11a can be wire-bonded to the substrate 10 through bonding wires (not shown). The conductive bumps 11ab may be formed from, for example, tin, copper or any other suitable electrically conductive material. The components 11b are surface mounted to the substrate 10.

Although three components are shown in FIG. 1A (e.g., one component 11a and two components 11b), more components or fewer components can be included in other embodiments.

The package body 12 is disposed on the top surface 101 of the substrate 10 and covers the components 11a, 11b and the top surface 101 of the substrate 10, to provide mechanical stability as well as protection against oxidation, humidity, and other environmental conditions. The package body 12 may include, for example, an epoxy resin having fillers, a molding compound, an epoxy molding compound, a polyimide, a phenolic, or a material with silicones dispersed therein.

In one or more embodiments, a lateral surface 122 of the package body 12 and the lateral surface 103 of the substrate 10 are aligned (e.g., coplanar or substantially coplanar).

The EMI shield 13 covers a top surface 121 and the lateral surface 122 of the package body 12, and further covers a portion of the lateral surface 103 of the substrate 10, to provide protection against EMI. Another portion of the lateral surface 103 of the substrate 10 (e.g., towards the bottom surface 102 of the substrate 10) is exposed from the EMI shield 103 to avoid contact between the EMI shield 103 and the solder ball 10b, which could cause a short circuit. In some embodiments, a vertical extent of the covered portion of the lateral surface 103 may be greater than a vertical extent of the exposed portion of the lateral surface 103, such as where the vertical extent of the covered portion of the lateral surface 103 is more than about 50% of a thickness of the substrate 10, such as at least about 55%, at least about 60%, or at least about 65%, although the relative extent of the covered and exposed portions of the lateral surface 103 can be reversed or otherwise varied for other embodiments. The EMI shield 13 covers the connection surface of the exposed portion of the grounding element 10g in the embodiment illustrated in FIG. 1. In other embodiments, the EMI shield 13 partially covers the connection surface of the exposed portion of the grounding element 10g, while a remainder of the connection surface of the exposed portion of the grounding element 10g is uncovered by the EMI shield 13. The EMI shield 13 is electrically connected to the connection surface of the exposed portion of the grounding element 10g, and is grounded through the grounding element 10g, thereby reducing electromagnetic emissions. In one or more embodiments, the EMI shield 13 is a conductive layer, and the conductive layer can include one or more electrically conductive materials, such as metals or metal alloys.

Figure 2:
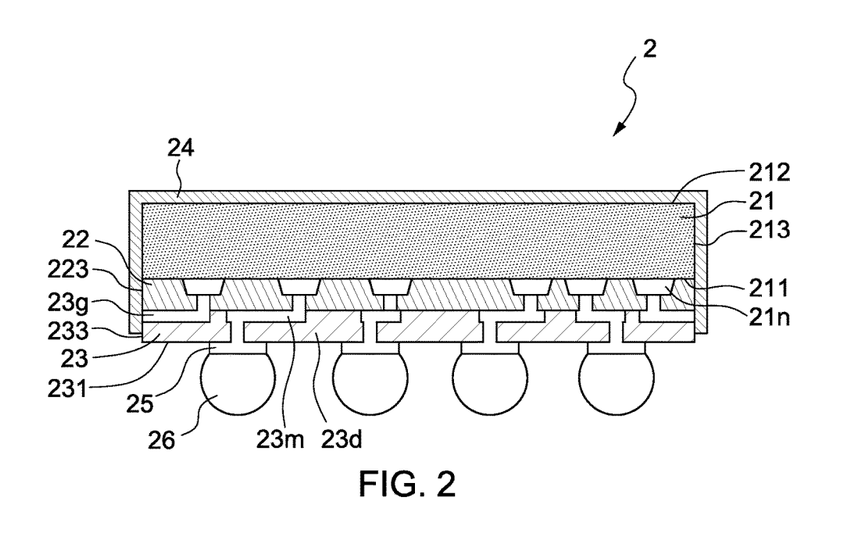
FIG. 2 illustrates a cross-sectional view of a semiconductor device package in accordance with an embodiment of the present disclosure.

FIG. 2 illustrates a cross-sectional view of a semiconductor device package 2 in accordance with an embodiment of the present disclosure. The semiconductor device package 2 includes a component 21, a passivation layer 22, a redistribution layer 23 and an EMI shield 24. In one or more embodiments, the semiconductor device package 2 is a wafer level chip scale package.

The component 21 is an active component, such as a die. The component 21 includes a first surface 211, a second surface 212 opposite to the first surface 211, and a lateral surface 213 extending between the first surface 211 and the second surface 212. The component 21 includes electrical nodes 21n on the first surface 211 thereof.

The passivation layer 22 is disposed on the first surface 211 of the component 21. The passivation layer 22 may be a non-conductive or an insulating polymer such as polyimide (PI), epoxy, polybenzoxazole (PBO) or benzocyclobutene (BCB); alternatively, an inorganic passivation layer, such as silicon dioxide ($SiO_2$) may be used.

The redistribution layer 23 is disposed on the passivation layer 22, and includes a dielectric layer 23d and a metal layer 23m. The redistribution layer 23 includes a first surface 231 and a lateral surface 233 substantially orthogonal to the first surface 231. Conductive pads 25 are disposed on the first surface 231 of the redistribution layer 23. In one or more embodiments, solder balls 26 are connected to the conductive pads 25. The solder balls 26 provide input and output electrical connections for the semiconductor device package 2. In one or more embodiments, at least some of the solder balls 26 are electrically connected to the component 21 by way of electrical interconnects included in the passivation layer 22 and the redistribution layer 23. The redistribution layer 23 includes a grounding element 23g, where a portion of the grounding element 23g has a connection surface exposed from the lateral surface 233 of the redistribution layer 23. In one or more embodiments, the grounding element 23g is a portion of an internal grounding via or an internal grounding trace disposed in the redistribution layer 23. In one or more embodiments, the grounding element 23g is a grounding ring disposed along the lateral surface 233 of the redistribution layer 23. In one or more embodiments, the redistribution layer 23 includes multiple grounding elements 23g.

The dielectric layer 23d may be a non-conductive or an insulating polymer such as polyimide (PI), epoxy, polybenzoxazole (PBO) or benzocyclobutene (BCB).

The EMI shield 24 covers the second surface 212 and the lateral surface 213 of the component 21, a lateral surface 223 of the passivation layer 22, and a portion of the lateral surface 233 of the redistribution layer 23, to provide protection against EMI. Another portion of the lateral surface 233 of the redistribution layer 23 is exposed form the EMI shield 24 to avoid contact between the EMI shield 24 and the solder balls 26, which could cause a short circuit. The EMI shield 24 covers the connection surface of the exposed portion of the grounding element 23g in the embodiment illustrated in FIG. 2. In other embodiments, the EMI shield 24 partially covers the connection surface of the exposed portion of the grounding element 23g, while a remainder of the connection surface of the exposed portion of the grounding element 23g is uncovered by the EMI shield 24. The EMI shield 24 is electrically connected to the connection surface of the exposed portion of the grounding element 23g and is grounded through the grounding element 23g, thereby reducing electromagnetic emissions. In one or more embodiments, the EMI shield 24 is a conductive layer.

FIGS. 3A-3E illustrate a semiconductor process in accordance with an embodiment of the present disclosure.

Figure 3A:
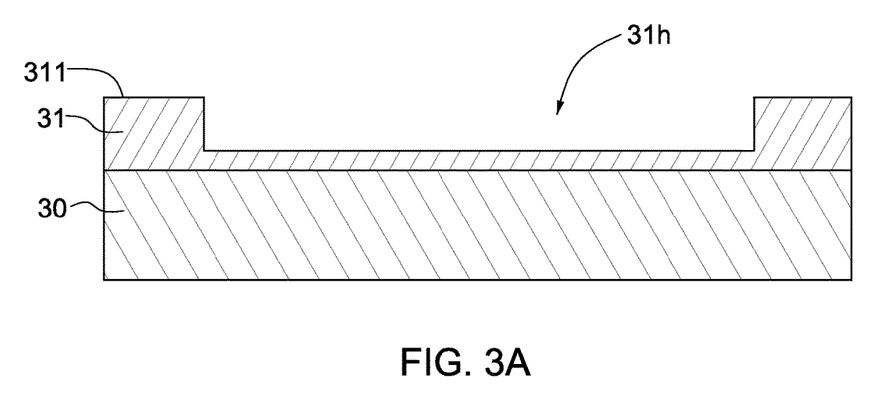
FIG. 3A, FIG. 3B, FIG. 3C, FIG. 3D and FIG. 3E illustrate a manufacturing process in accordance with an embodiment of the present disclosure.

Referring to FIG. 3A, a first carrier 30 and a second carrier 31 are provided. The second carrier 31 is attached to the first carrier 30. A cavity 31h is formed from a top surface 311 of the second carrier 31 toward the first carrier 30, but does not extend fully through the second carrier 31. The first carrier 30 and the second carrier 31 with the cavity 31h together form a container.

In one or more embodiments, the first carrier 30 is glass or polymethylmethacrylate (PMMA), and the second carrier 31 is polyethylene terephthalate (PET). Other materials may additionally or alternatively be used for the first carrier 30 and the second carrier 31.

Figure 3B:
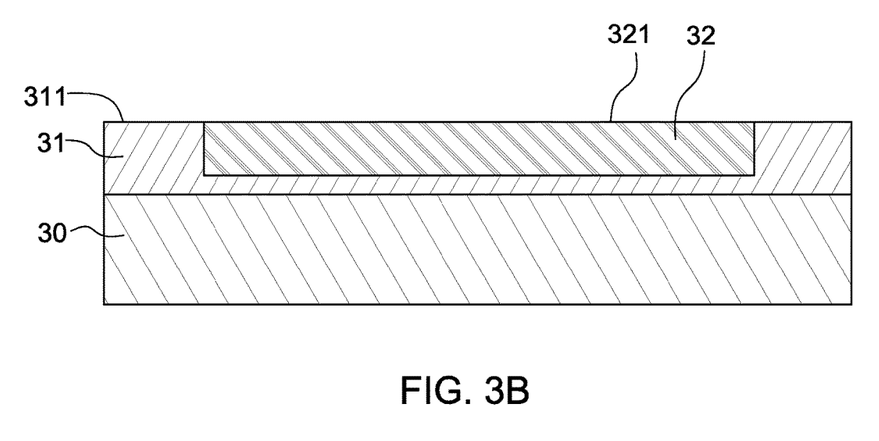

Referring to FIG. 3B, an adhesive 32 is injected into the container (e.g., into the cavity 31h of the second carrier 31), and excess (superfluous) adhesive 32 removed so that a top surface 321 of the adhesive 32 and the top surface 311 of the second carrier 31 are substantially coplanar. In one or more embodiments, the adhesive 32 is optically curable and, more particularly, is ultraviolet (UV) light curable. In one or more embodiments, the adhesive 32 is thermally curable. In one or more embodiments, the adhesive 32 is a peelable adhesive.

Figure 3C:
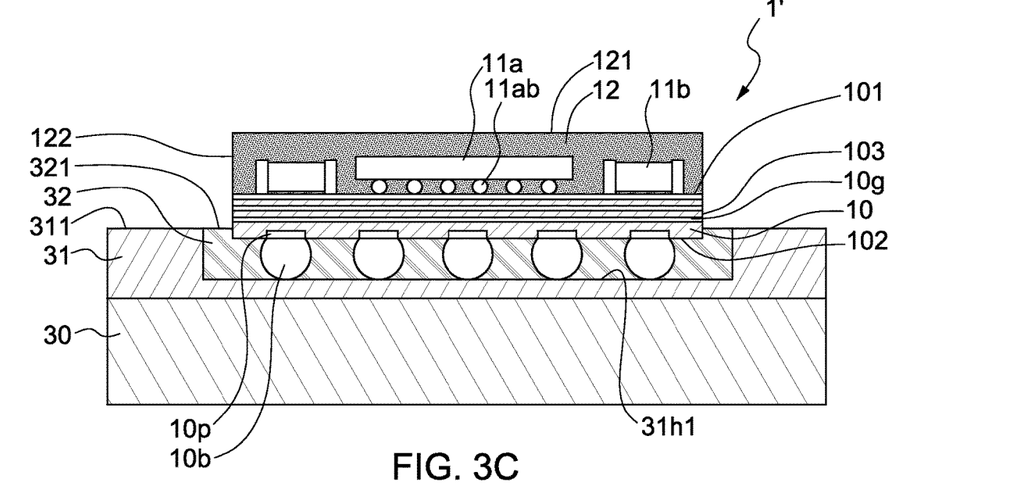

Referring to FIG. 3C, a semiconductor device package 1' is placed into the adhesive 32 in the container. The semiconductor device package 1' is similar to the semiconductor device package 1 shown in FIG. 1, except that the EMI shield 13 is omitted.

The semiconductor device package 1' is pressed so that the solder balls 10b of the semiconductor device package 1' are in contact with a bottom surface 31h1 of the cavity 31h. The top surface 311 of the second carrier 31 is lower than the grounding element 10g of the substrate 10, and thus the adhesive 32 does not cover the exposed portion of the grounding element 10g. After the semiconductor device package 1' is pressed into the adhesive 32, the adhesive 32 is cured or solidified. In one or more embodiments, the adhesive 32 can be cured using UV. In one or more embodiments, the adhesive 32 can be cured by heating.

In one or more embodiments, the semiconductor device package 1' can be formed by: (i) providing a substrate 10; (ii) attaching electronic components 11a, 11b onto the substrate 10; (iii) forming conductive pads 10p on a bottom surface 102 of the substrate 10; (iv) forming a package body 12 on the substrate 10 to encapsulate the electronic components 11a, 11b and a top surface 101 of the substrate 10; and (v) forming solder balls 10b on the conductive pads 10p.

The substrate 10 may be, for example, a PCB, such as a paper-based copper foil laminate, a composite copper foil laminate, or a polymer-impregnated glass fiber-based copper foil laminate. The substrate 10 may be replaced by any other suitable carrier, such as a leadframe.

In the embodiment illustrated in FIG. 3C, the component 11a is flip chip bonded to the substrate 10 by way of conductive bumps 11ab. In other embodiments, the component 11a can be wire-bonded to the substrate 10. The conductive bumps 11ab may be, for example, tin, copper or any other suitable electrically conductive material. The components 11b are surface mounted to the substrate 10 in the embodiment illustrated in FIG. 3C. Other mounting techniques may be used in other embodiments.

The package body 12 may be formed, for example, by applying an encapsulant to the top surface 101 of the substrate 10 to substantially cover or encapsulate the components 11a, 11b and the top surface 101 of the substrate 10. In one or more embodiments, the encapsulant can include, for example, a Novolac-based resin, an epoxy-based resin, a silicone-based resin, or any other suitable encapsulant material. In one or more embodiments, the encapsulant can be applied by using one or more of a number of molding techniques, such as compression molding, injection molding, and transfer molding.

Figure 3D:
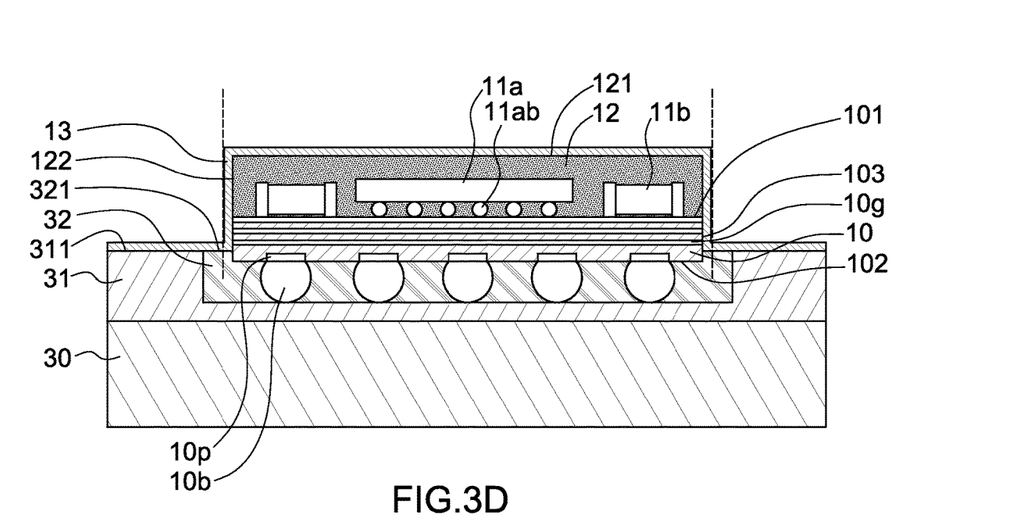

Referring to FIG. 3D, an EMI shield 13 is formed on exposed surfaces, including on a top surface 121 and a lateral surface 122 of the package body 12, and on a portion of a lateral surface 103 of the substrate 10 that is not covered by the adhesive 32. The EMI shield 13 can be formed using one or more of a number of coating techniques, such as chemical vapor deposition (CVD), physical vapor deposition (PVD), electroless plating, electroplating, printing, spraying, sputtering, and vacuum deposition. After the EMI shield 13 is formed, a cutting process is performed along a lateral surface of the EMI shield 13, such as along the dotted lines in FIG. 3D, to cut through the adhesive 32. The cutting process may be performed, for example, by blade sawing or laser cutting.

Figure 3E:
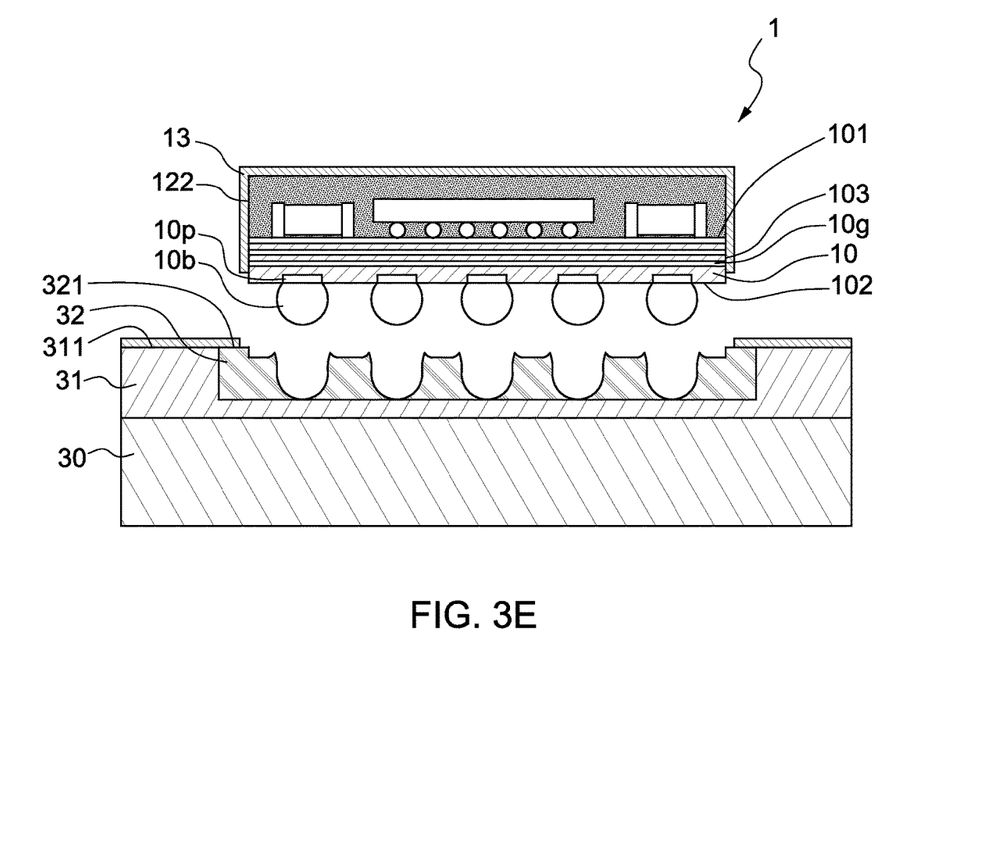

Referring to FIG. 3E, the adhesive 32, the first carrier 30 and the second carrier 31 are separated from the semiconductor device package 1' to form the semiconductor device package 1 as shown in FIG. 1.

According to the process illustrated in FIGS. 3A-3E, because the adhesive 32 is cured before the EMI shield 13 is formed, the conductive pads 10p and the solder balls 10b are protected by the cured adhesive 32 so that metal or conductive material forming the EMI shield 13 does not contact the conductive pads 10p or the solder balls 10b.

In addition, for the embodiment illustrated in FIGS. 3A-3E, because the adhesive 32 does not cover the exposed portion of the grounding element 10g (see FIG. 3C), the EMI shield 13 covers the exposed portion of the grounding element 10g when the coating process in FIG. 3D is performed. Therefore, the semiconductor device package 1 has improved electromagnetic shielding capabilities. A similar process can be used to form the package 2 of FIG. 2.

Figure 4A:
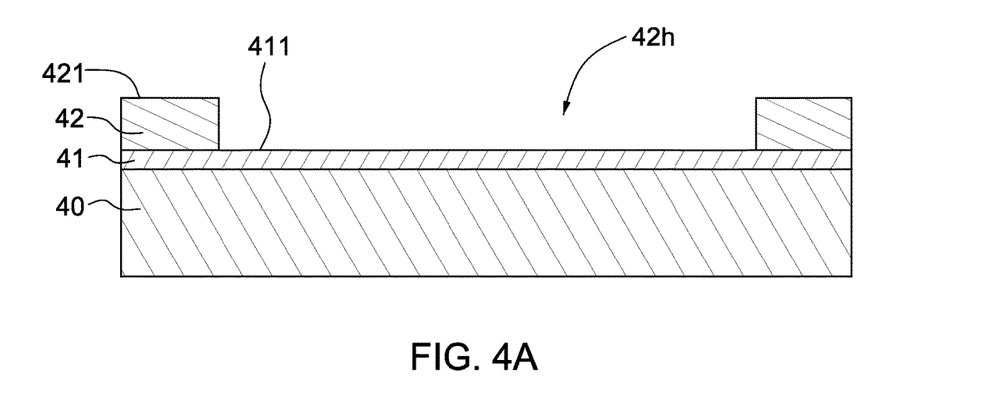
FIG. 4A, FIG. 4B, FIG. 4C, FIG. 4D and FIG. 4E illustrate a manufacturing process in accordance with an embodiment of the present disclosure.

FIGS. 4A-4E illustrate a semiconductor process in accordance with another embodiment of the present disclosure. The semiconductor process shown in FIGS. 4A-4E is similar to the process shown in FIGS. 3A-3E, except that forming a cavity 42h shown in FIG. 4A is different from forming the cavity 31h as shown in FIG. 3A.

Referring to FIG. 4A, a first carrier 40 and a second carrier 41 are provided. The second carrier 41 is attached to the first carrier 40. A first adhesive 42 is applied to, or formed on, a top surface 411 of the second carrier 41, around a periphery of the second carrier 41. After the first adhesive 42 is cured, the cavity 42h is surrounded by a solid first adhesive 42. The first carrier 40 and the second carrier 41 with the cured first adhesive 42 together form a container.

Figure 4B:
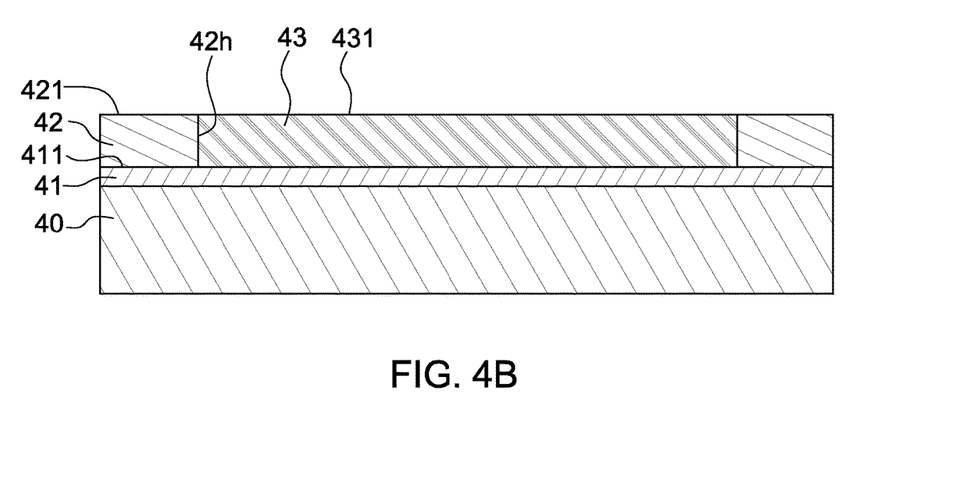

Referring to FIG. 4B, a second adhesive 43 is injected into the container (e.g., into the cavity 42h), and excess (superfluous) second adhesive 43 is removed so that a top surface 431 of the second adhesive 43 and the top surface 421 of the first adhesive 42 are substantially coplanar. In one or more embodiments, one or both of the first adhesive 42 and the second adhesive 43 are optically curable and, more particularly, are UV curable. In one or more embodiments, one or both of the first adhesive 42 and the second adhesive 43 are thermally curable. In one or more embodiments, one or both of the first adhesive 42 and the second adhesive 43 are a peelable adhesive. In one or more embodiments, the first adhesive 42 is the same as the second adhesive 43. In one or more embodiments, the first adhesive 42 is different from the second adhesive 43.

Figure 4C:
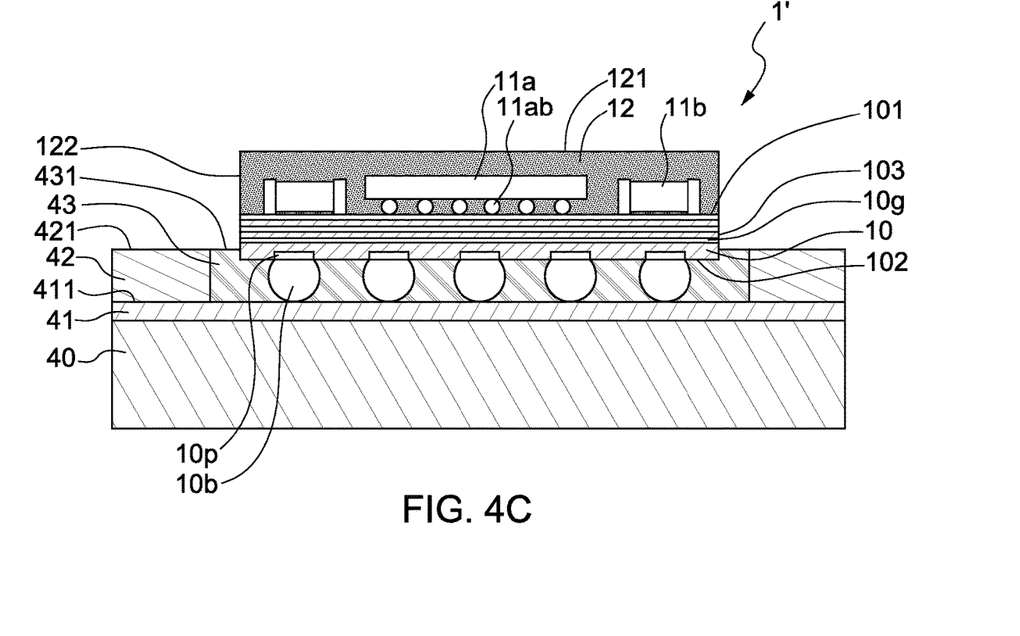

Referring to FIG. 4C, a semiconductor device package 1' is placed into the second adhesive 43 in the container. The semiconductor device package 1' is the same as that shown in FIG. 3C.

The semiconductor device package 1' is pressed so that the solder balls 10b of the semiconductor device package 1' are in contact with the top surface 411 of the second carrier 41. The top surface 421 of the first adhesive 42 is lower than the grounding element 10g of the substrate 10, and thus the second adhesive 43 does not cover the exposed portion of the grounding element 10g. After the semiconductor device package 1' is pressed into the second adhesive 43, the second adhesive 43 is cured to become solid. In one or more embodiments, the second adhesive 43 can be cured using UV. In one or more embodiments, the second adhesive 43 can be cured by heating.

Figure 4D:
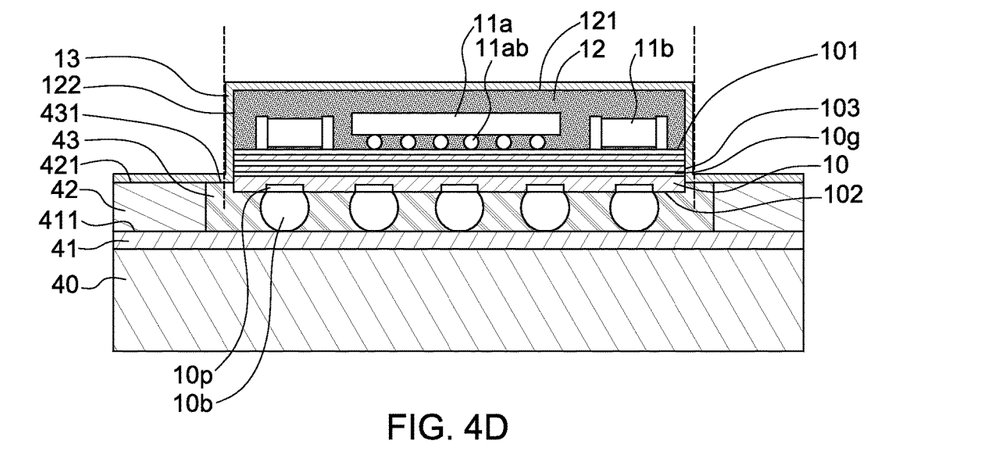

Referring to FIG. 4D, an EMI shield 13 is formed on exposed surfaces, including on the top surface 121 and the lateral surface 122 of the package body 12, and on a portion of the lateral surface 103 of the substrate 10 that is not covered or encapsulated by the second adhesive 43. The EMI shield 13 can be formed using one or more of a number of coating techniques, such as CVD, PVD, electroless plating, electroplating, printing, spraying, sputtering, and vacuum deposition. After the EMI shield 13 is formed, a cutting process is performed along the lateral surface of the EMI shield 13, such as along the dotted lines in FIG. 4D, to cut through the second adhesive 43. The cutting process may be performed, for example, by blade sawing or laser cutting.

Figure 4E:
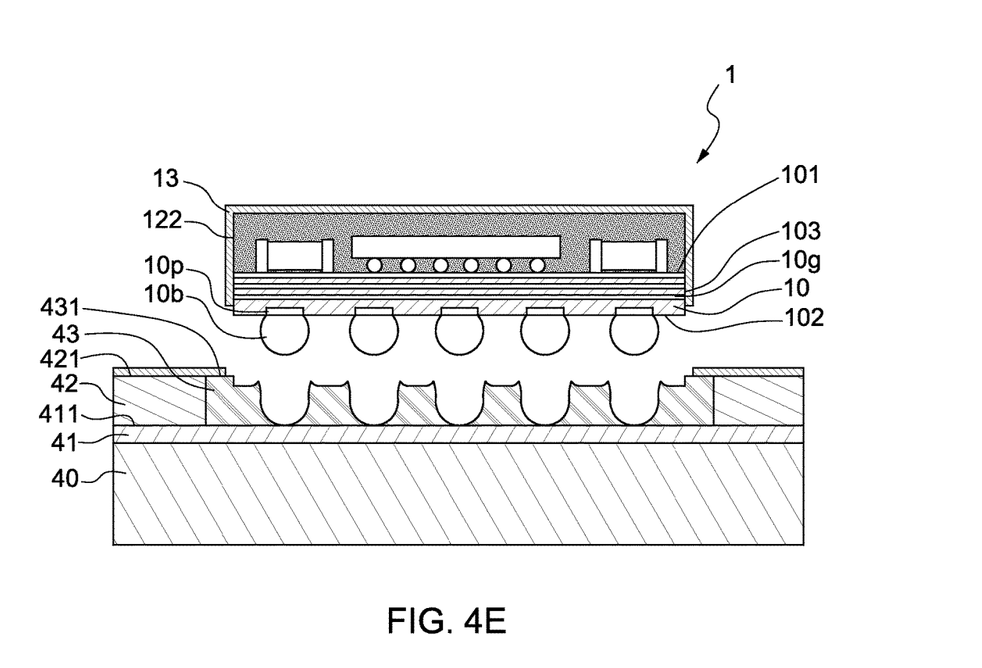

Referring to FIG. 4E, the first adhesive 42, the second adhesive 43, the first carrier 40 and the second carrier 41 are separated from the semiconductor device package 1', to form the semiconductor device package 1 as shown in FIG. 1. A similar process can be used to form the package 2 of FIG. 2.

Figure 5A:
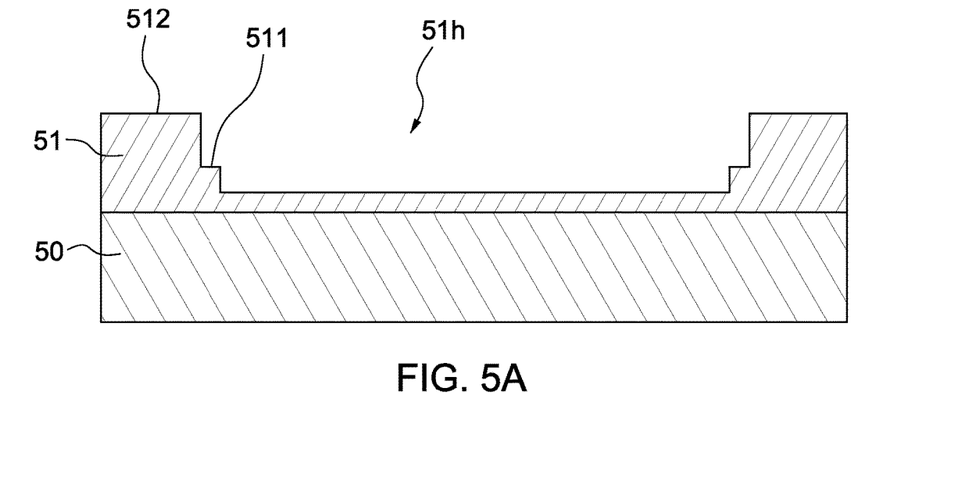
FIG. 5A, FIG. 5B, FIG. 5C, FIG. 5D, FIG. 5E and FIG. 5F illustrate a manufacturing process in accordance with an embodiment of the present disclosure.

FIGS. 5A-5F illustrate a semiconductor process in accordance with another embodiment of the present disclosure. The semiconductor process shown in FIGS. 5A-5F is similar to the process shown in FIGS. 3A-3E, except that forming the cavity 51h shown in FIG. 5A is different from forming the cavity 31h shown in FIG. 3A.

Referring to FIG. 5A, a first carrier 50 and a second carrier 51 are provided. The second carrier 51 is attached to the first carrier 50. A cavity 51h with a stepped shape is formed from a top surface 512 of the second carrier 51 toward the first carrier 50, but does not extend fully through the second carrier 51. The first carrier 50 and the second carrier 51 with cavity 51h together form a container.

Figure 5B:
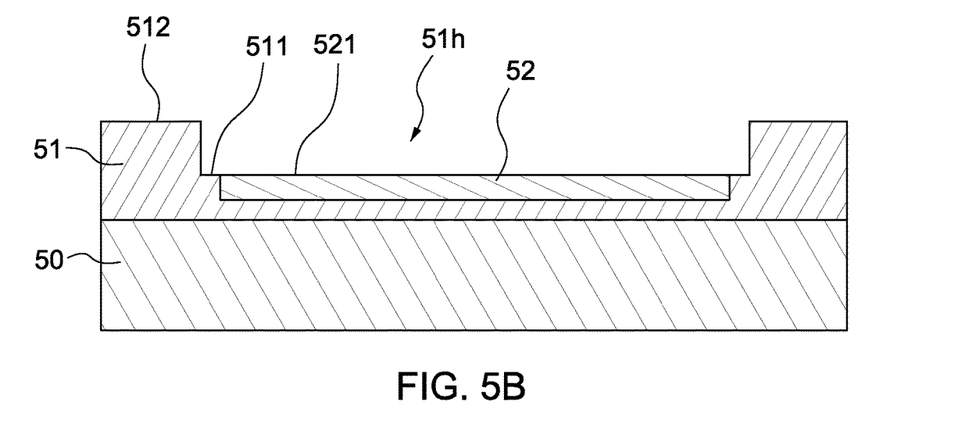

Referring to FIG. 5B, a first adhesive 52 is injected into the container (e.g., into cavity 51h) and excess (superfluous) first adhesive 52 is removed so that a top surface 521 of the first adhesive 52 and an upper surface 511 of the second carrier 51 are substantially coplanar. The first adhesive 52 is cured to become solid. In one or more embodiments, the first adhesive 52 is optically cured and, more particularly, is UV cured. In one or more embodiments, the first adhesive 52 is thermally cured. The first adhesive 52 may be similar to the adhesive 32 as described above.

Figure 5C:
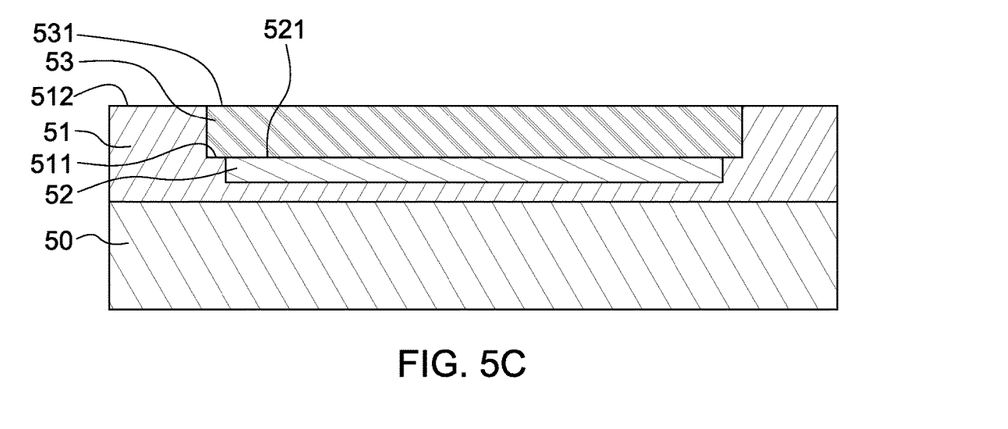

Referring to FIG. 5C, a second adhesive 53 is injected into the container (e.g., into cavity 51h), and excess (superfluous) second adhesive 53 is removed so that a top surface 531 of the second adhesive 53 and the top surface 512 of the second carrier 51 are substantially coplanar. In one or more embodiments, the second adhesive 53 is optically curable and, more particularly, is UV curable. In one or more embodiments, the second adhesive 53 is thermally curable. The second adhesive 53 may be similar to the adhesive 32 as described above. In one or more embodiments, the first adhesive 52 is the same as the second adhesive 53. In one or more embodiments, the first adhesive 52 is different from the second adhesive 53.

Figure 5D:
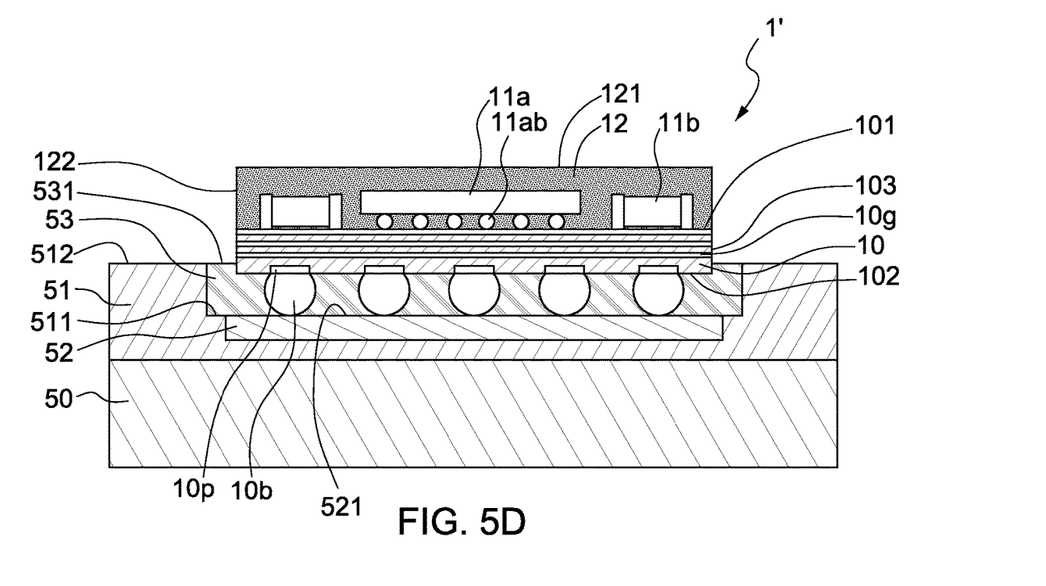

Referring to FIG. 5D, a semiconductor device package 1' is placed into the second adhesive 53 in the container. The semiconductor device package 1' is the same as that shown in FIG. 3C. The semiconductor device package 1' is pressed so that the solder balls 10b of the semiconductor device package 1' are in contact with the top surface 521 of the first adhesive 52. The top surface 531 of the second adhesive 53 is lower than the grounding element 10g of the substrate 10, and thus the second adhesive 53 does not cover the exposed portion of the grounding element 10g. After the semiconductor device package 1' is pressed into the second adhesive 53, the second adhesive 53 is cured to become solid. In one or more embodiments, the second adhesive 53 can be cured using UV. In one or more embodiments, the second adhesive 53 can be cured by heating.

Figure 5E:
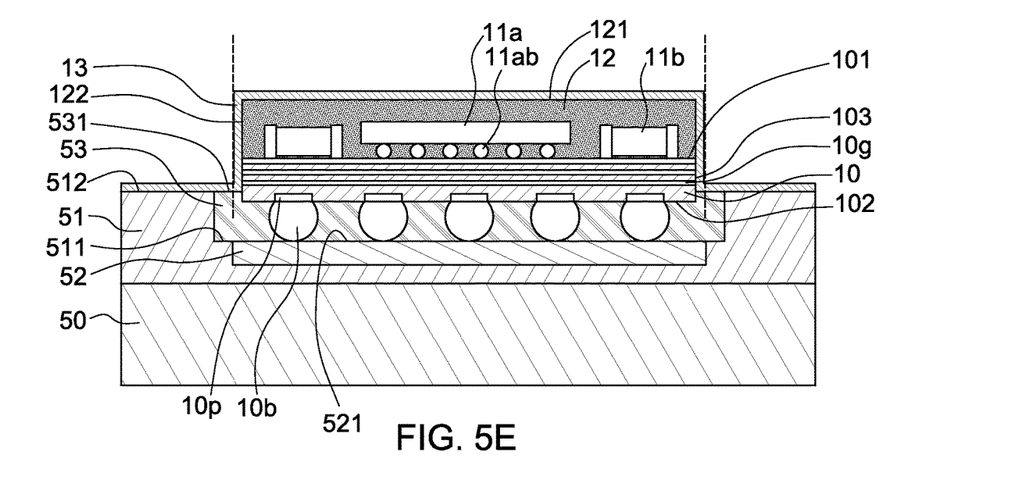

Referring to FIG. 5E, an EMI shield 13 is formed on exposed surfaces, including on the top surface 121 and the lateral surface 122 of the package body 12, and on a portion of the lateral surface 103 of the substrate 10 that is not covered or encapsulated by the second adhesive 53. The EMI shield 13 can be formed using one or more of a number of coating techniques, such as CVD, PVD, electroless plating, electroplating, printing, spraying, sputtering, and vacuum deposition. After the EMI shield 13 is formed, a cutting process is performed along a lateral surface of the EMI shield 13, such as along the dotted lines in FIG. 5E, to cut through the second adhesive 53. The cutting process may be performed, for example, by blade sawing or laser cutting.

Figure 5F:
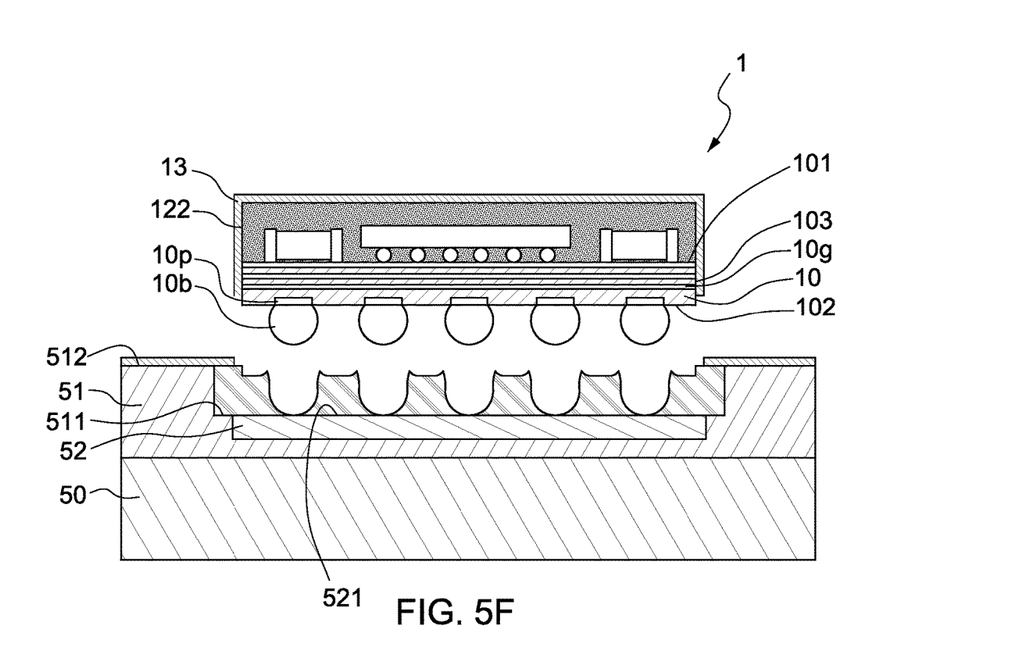

Referring to FIG. 5F, the first adhesive 52, the second adhesive 53, the first carrier 50 and the second carrier 51 are separated from the semiconductor device package 1' to form the semiconductor device package 1 shown in FIG. 1. A similar process can be used to form the package 2 of FIG. 2.

Referring back to FIG. 3E, a portion of the adhesive 32 may remain on the conductive pads 10p or the solder balls 10b during the separation process due to the adhesive strength of adhesive 32, and may be removed by a cleaning or removal operation. Similar phenomenon may occur in the process as shown in FIG. 4E. In the manufacturing process shown in FIGS. 5A-5F, the first adhesive 52 is cured prior to injecting the second adhesive 53, which is subsequently cured. In this manner, the first adhesive 52 tends to hold the second adhesive 53 and prevent it from following the semiconductor device package 1 when separated from the semiconductor device package 1' (FIG. 5F), so that the phenomenon of the adhesive 52 or 53 remaining on the conductive pads 10p or the solder balls 10b may be reduced.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, the terms "substantially orthogonal" can refer to 90°±10°, such as 90°±5°, 90°±4°, 90°±3°, 90°±2°, 90°±1°, 90°±0.5°, 90°±0.1°, or 90°±0.05°.

The term "substantially planar" can refer to a difference between a highest point and a lowest point of a surface of about no greater than 1 μm, no greater than 8 μm, or no greater than 10 μm. Lateral surfaces can be deemed to be "substantially coplanar" if any displacement between the lateral surfaces is no greater than 10 μm, such as no greater than 8 μm, no greater than 5 μm, or no greater than 1 μm.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of manufacturing a semiconductor device package, comprising:
    (a) providing a substrate having a top surface, a bottom surface opposite to the top surface, and a lateral surface extending from the top surface to the bottom surface, wherein the lateral surface includes a first portion adjacent to the bottom surface and a second portion aligned with the first portion and adjacent to the top surface, the substrate including a grounding element exposed at the second portion of the lateral surface of the substrate;
    (b) attaching at least one electronic component on the top surface of the substrate;
    (c) forming a package body on the substrate to encapsulate the electronic component and the top surface of the substrate;
    (d) covering the first portion of the lateral surface and the bottom surface of the substrate with a first adhesive;
    (e) forming a conductive layer on a top surface and a lateral surface of the package body, the second portion of the lateral surface of the substrate, and an exposed portion of the grounding element; and
    (f) removing the first adhesive.

2. The method of claim 1, further comprising curing the first adhesive after (d).

3. The method of claim 1, further comprising placing the substrate into the first adhesive in a container in (d).

4. The method of claim 3, wherein the container is provided by:
    providing a carrier defining a recess from a top surface of the carrier,
    wherein the top surface of the carrier is lower than the second portion of the lateral surface of the substrate.

5. The method of claim 3, wherein the container is provided by:
    providing a carrier; and
    applying a second adhesive on the carrier,
    wherein a top surface of the second adhesive is lower than the second portion of the lateral surface of the substrate.

6. The method of claim 3, further comprising removing excess first adhesive before placing the substrate into the first adhesive in the container so that a top surface of the first adhesive is aligned with a top surface of the container.

7. The method of claim 3, wherein the container is provided by:
    providing a carrier defining a first recess from a top surface of the carrier; and
    defining a second recess beneath the first recess,
    wherein the top surface of the carrier is lower than the second portion of the lateral surface of the substrate.

8. The method of claim 7, further comprising applying a second adhesive within the second recess, wherein a top surface of the first adhesive is lower than the second portion of the lateral surface of the substrate.

9. The method of claim 1, further comprising in (e):
    cutting the first adhesive along a lateral surface of the conductive layer; and
    separating the substrate from the first adhesive.

10. A method of manufacturing a semiconductor device package, the method comprising:
    (a) pressing a substrate with a package body encapsulating a top surface of the substrate into a material in a container to cover a first portion of a lateral surface of the substrate;
    (b) forming a conductive layer to cover a top surface and a lateral surface of the package body and to further cover a second portion other than the first portion of the lateral surface of the substrate; and (c) removing the container and the material by cutting the material along a lateral surface of the conductive layer, and separating the substrate from the material.

11. The method of claim 10, further comprising curing the material after (a).

12. The method of claim 10, further comprising removing excess material in the container prior to (a), so that a top surface of the material is aligned with a top surface of the container.

13. The method of claim 10, further comprising curing the material.

14. A method comprising:
   (a) pressing a semiconductor device package into a material to cover a portion of the semiconductor device package;
   (b) forming an electromagnetic interference shield to cover a remaining portion of the semiconductor device package exposed from the material; and
   (c) separating the semiconductor device package from the material by cutting the material along a lateral surface of the semiconductor device package.

15. The method of claim 14, wherein the material includes an adhesive, and the method further comprises curing the adhesive after (a).

16. The method of claim 14, wherein the semiconductor device package includes a grounding element, and (a) includes pressing the semiconductor device package into the material, such that a connection surface of the grounding element is exposed from the material.

17. The method of claim 16, wherein a top surface of the material is lower than the connection surface of the grounding element.

18. The method of claim 14, wherein (b) includes coating a metal over the remaining portion of the semiconductor device package exposed from the material.

* * * * *